United States Patent
Shiraishi

Patent Number: 5,124,646
Date of Patent: Jun. 23, 1992

[54] UNIVERSAL PROBE CARD FOR USE IN A SEMICONDUCTOR CHIP DIE SORTER TEST

[75] Inventor: Shogo Shiraishi, Kitakyushu, Japan

[73] Assignee: Kabushiki Kaisha Toshiba, Kawasaki, Japan

[21] Appl. No.: 626,286

[22] Filed: Dec. 12, 1990

[30] Foreign Application Priority Data

Dec. 15, 1989 [JP] Japan .................. 1-325628

[51] Int. Cl.⁵ ........................................... G01R 31/02
[52] U.S. Cl. .......................... 324/158 P; 324/158 F; 439/482
[58] Field of Search ............... 324/158 P, 158 F, 72.5, 324/158 R; 439/482, 70, 68, 842

[56] References Cited

U.S. PATENT DOCUMENTS

| | | | |
|---|---|---|---|
| 2,954,521 | 9/1960 | McKee | 324/158 P |
| 4,138,643 | 2/1979 | Beck et al. | 324/158 P |
| 4,926,119 | 5/1990 | Prokopp | 324/158 P |

FOREIGN PATENT DOCUMENTS

| | | | |
|---|---|---|---|
| 3406796 | 8/1984 | Fed. Rep. of Germany | 324/158 P |
| 2140228 | 11/1984 | United Kingdom | 324/158 P |

Primary Examiner—Vinh Nguyen
Attorney, Agent, or Firm—Finnegan, Henderson, Farabow, Garrett and Dunner

[57] ABSTRACT

In a probe card, a plurality of holes are provided in a performance board and a probe needle is inserted through the hole and movable via the performance board in an up/down motion without being secured to the performnce board. A spring is held in place around the probe needle. A securing board is located relative to the performance board and a plurality of pistons each has an end which is projected via the securing board and are provided on the securing board to allow the corresponding probe needle to push. Upon the operation of the air cylinder in a position corresponding to the pad of the chip to be tested, the corresponding probe needle is selectively pushed, by the projecting end of the piston, into contact with the pad of any detected chip to start the measurement of the chip. When the air cylinder is not operated, the corresponding probe needle is pushed up, by the spring, away from the chip. Probe needles can be properly selected by one probe card and handle the corresponding pads of various types of semiconductor elements. Since the probe needles are not secured to the associated board, the present probe card can readily cope with the situation which would otherwise require a whole or partial replacement of the probe needles with new ones in accordance with various types of semiconductor devices.

2 Claims, 3 Drawing Sheets

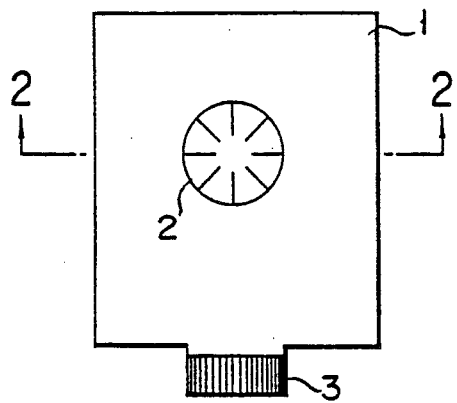
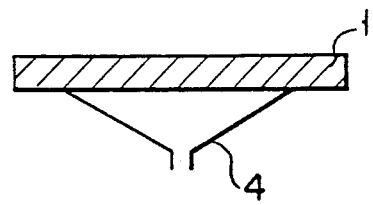
FIG. 1A (PRIOR ART)
FIG. 1B (PRIOR ART)
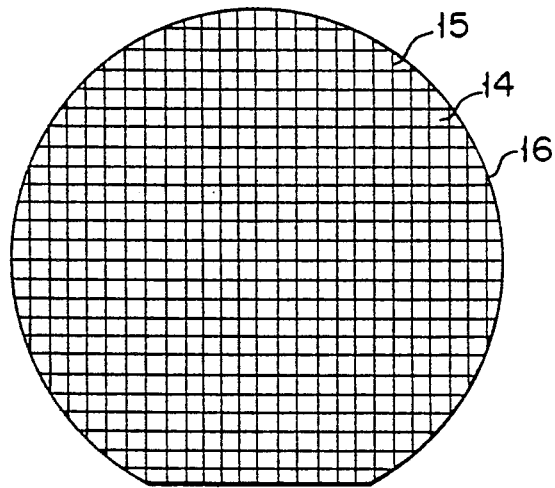
FIG. 2

UNIVERSAL PROBE CARD FOR USE IN A SEMICONDUCTOR CHIP DIE SORTER TEST

Background of the Invention

1. Field of the Invention

The present invention relates to a probe card for use in the steps of testing a plurality of circuit component parts, such as active elements, passive elements or resistors formed in and on a semiconductor substrate and, in particular, to a probe card for use in the probing of a semiconductor substrate structure at a die sorter testing step.

2. Description of the Related Art

A probe card has been used at the steps of testing a plurality of circuit component parts, such as active elements, passive elements or resistors formed in and on a semiconductor substrate. As shown in FIG. 2, a number of semiconductor chips 14 are formed in and on a semiconductor wafer 16 and a plurality of pads or electrodes formed of a conductive metal, such as Al or Al alloy (Al-Si, Al-Si-Cu, etc.), are formed over the semiconductor chip 14. Reference numeral 15 in FIG. 2 represents a dicing line. The probe card has probe needles corresponding in number to pads formed over the chip of a semiconductor substrate to be tested. The probe card has its needles pushed against the individual chip of the semiconductor wafer so that testing is done for each individual chip. Stated in another way, the probe needles are pushed against the pads on the chip so that testing may be made for the properties of active elements, passive elements, resistors, etc. formed in and on the semiconductor substrate.

Now a conventional probe card will be explained below with reference to FIGS. 1A and 1B.

As shown in FIG. 1A, a circular hole 2 is formed at a central area of a board 1 and a connector 3 for connection to an IC (integrated circuit) tester is formed at one end of the board 1. Probe needles 4 are electrically connected to the terminals of the connector 3 by connection conductors, not shown. Since the probe needle to be connected to the respective connector terminal is not replaced by another probe needle and the probe needle corresponding to a respective pad on the respective chip is not replaced by another probe needle, the corresponding connector and probe pad are not changed by different ones. The probe needles 4 are inclined from an inner edge of the hole 2 towards a center axis of the hole. The forward end portions of the probe needles 4 are bent in a vertical direction to allow them to contact with the corresponding pads over the semiconductor substrate to be tested. The number of the probe needles 4 needs to correspond to that of the pads formed over the chip. In those semiconductor devices whose integration density has been enhanced recently, a larger number of probe needles are required to correspond to an increasing number of probe needles involved.

For those probe cards which have presently been employed in the art, it is necessary to have probe needles corresponding to those pads to be tested. Since a different probe card is needed for a different type semiconductor device, many probe cards have to be prepared, resulting in an added cost. However, a greater skill and lots of time are required for replacement of a probe card by a new one corresponding to a semiconductor element. Furthermore, if some of probe needles are injured or some of the probe needles needs to be replaced due to other reasons, a replacement operation is very difficult because probe needles are fixed to the board.

SUMMARY OF THE INVENTION

It is accordingly an object of the present invention to provide a probe card, which can be employed commonly for a larger number of types of semiconductor elements.

Another object of the present invention is to provide a probe card which can correctly handle a larger number of types of semiconductor elements without requiring an operator's great skill.

Another object of the present invention is to provide a probe card which allows a ready replacement of probe needles with new ones.

These objects and advantages can be achieved by a present probe card as will be set out below.

According to the present invention, there is provided a probe card comprising:

a securing board and a performance board arranged opposite to the securing board and having a plurality of holes;

a plurality of probe needles, each, inserted through the hole to allow it to be moved, in an up/down motion, through the performance board;

a spring biasing the corresponding needle away from corresponding semiconductor element pad, to be tested, and back into a retracted position; and probe needle reciprocating means having a piston corresponding to the probe needle and having its end projected via the securing board and adapted to selectively push the probe needle, the number of the probe needle reciprocating means being equal to that of the probe needles, wherein, by the projecting ends of the pistons of the probe needle reciprocating means, the probe needles are selectively pushed against a biasing force of the spring and into contact with the corresponding semiconductor element pad.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a plan view showing a conventional probe card;

FIG. 1B is a cross-sectional view, taken along line a—a, showing the probe card of FIG. 1A;

FIG. 2 is a plan view showing a semiconductor wafer marked with a dicing line;

DETAILED DESCRIPTION OF THE PREFERRED EMBODIMENTS

An embodiment of the present invention will be explained below with reference to the accompanying drawings.

Figure 3:
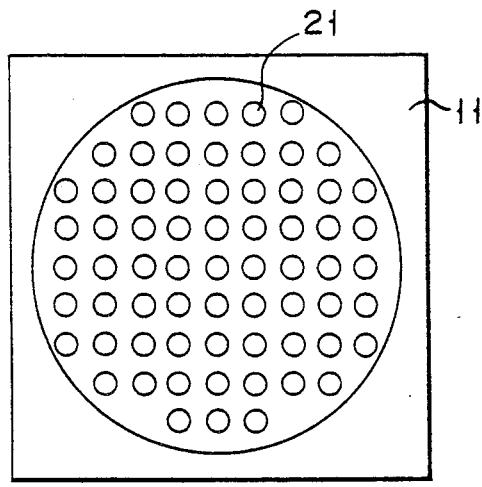
FIG. 3 is a bottom view showing a state before the insertion of probe needles of a probe card according to the present invention.
Figure 4:
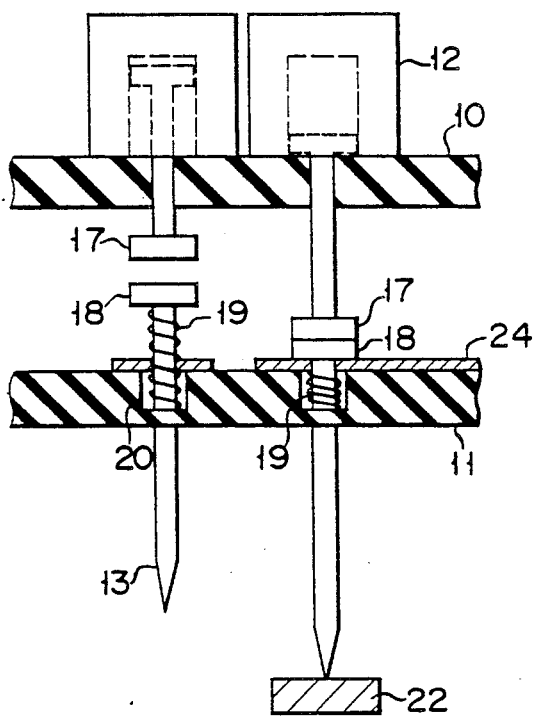
FIG. 4 is a cross-sectional view showing a major part of a probe card of the present invention.

As shown in FIG. 4, a securing board 10 is provided opposite to a performance board 11. As shown in FIG. 3, a plurality of holes 21 are provided in the performance board 11 to allow corresponding probe needles 13 to be inserted therethrough. A recess 20 is provided around the hole 21. The probe needle 13 has a head 18 of a larger diameter at an upper end and is inserted down into the hole 11 of the performance board 11 past a coil spring of a predetermined length placed in the recess 20 of the hole 11 with the upper end of the spring 19 abutted against the lower surface of the head 18. The forward end of the probe needle 13 thus extends down through the hole 21 of the performance board 11 into contact with the pad, but the needle cannot pass entirely out of the hole of the performance board because the diameter of the turn of the coil spring in the recess and that of the head 18 are greater than the diameter of the hole 21 of the performance board. The spring 19 has its lower end supported on the bottom surface of the recess 20 of the hole of the performance board. Probe needle reciprocating means, such as air cylinders, are so provided as to correspond in number to the probe needles 13. The air cylinder 12 is mounted on the securing board 10 in a manner to be located opposite the end of the probe needle 13 s that it allows the probe needle to be moved through the hole of the performance board. The end 17 of a piston of the air cylinder 12 extends down past the securing board 10. Upon the actuation of the air cylinders 12, the piston ends 17 push against the heads 18 of the probe needles 13. By so doing, the respective probe needle 13 inserted into the hole of the performance board 11 is vertically pushed down via the hole of the performance board 11 against a force of the spring 19 and into contact with the corresponding pad 22 of the semiconductor element (see the probe needle 13 as shown to the right in FIG. 3). The opposed surfaces of the piston end 17 and needle head 18 are shaped flat to secure stable contact with each other. Upon the pushing of the needle head 18 by the piston end 17 in a down direction, the spring 19 is pushed into the recess 20 at the hole of the performance board and stored there.

With the air cylinder 12 not actuated, the piston end 17 placed in a lifted state, and the needle head 18 not pushed down, the spring 19 pushes the needle head 18 upwardly so that the forward end of the probe needle 13 is moved away from the pad (see the probe needle 13 to the left of FIG. 3). It is thus possible to control the up/down movement of the probe needle 13.

Figure 5:
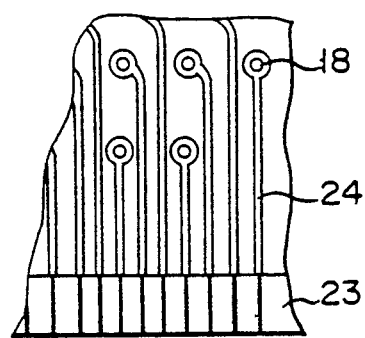
FIG. 5 is a wiring pattern of a probe card of the present invention.
Figure 6:
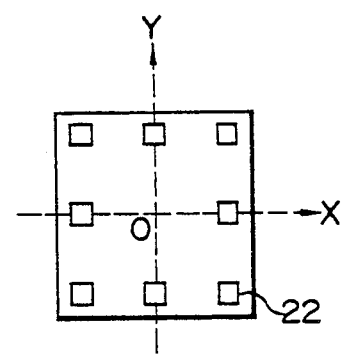
FIG. 6 is an explanative view for determining the coordinates position of pads on one chip.

As shown in FIG. 5, a wiring pattern 24 and connector 23 are provided on the performance board 11 of the probe card, the wiring pattern 24 being used to connect the probe needle to a tester and the connector 23 being provided at the end of the wiring pattern. The probe needle 13 is electrically connected to the connector 23, as in the prior art, by the wiring pattern 24 formed on the performance board 11. In the conventional probe card, probe needles are specifically employed for a specific semiconductor element, but, according to the probe card of the present invention, it can be employed commonly for many types of semiconductor elements. In order to derive the outputs of the probe needles corresponding to the pad numbers customarily set for a semiconductor element, a means, not shown, is provided for initially programming the terminal numbers of a connector corresponding to pad numbers in accordance with the types of semiconductor elements and selectively taking out, as data items, the terminals of the connector connected to the probe needles, corresponding to the respective pads, in accordance with the types of semiconductor elements to be tested.

Upon the making of a die sorter testing, data items corresponding to the type of semiconductor elements are input to a probing apparatus, not shown, and the piston ends 17 of the air cylinders 17 corresponding to pads formed on a specific semiconductor element are selected by the probing apparatus. By so doing, the piston ends 17 push corresponding probe needles 13 and, at the same time, the corresponding connector terminals are selected, as set out above, to generate a corresponding output signals. It is thus possible to provide a probe card having probe needles adaptable for various types of semiconductor elements to be tested.

A method for selecting any proper piston terminals 17 of the air cylinder 12 will be explained below. On an X, Y-axis coordinate system with a center of the chip 14 of the semiconductor element, to be tested, as an origin O, the positions of the pads are determined by $X=a$ $\mu$m and $Y=b$ $\mu$m. The positions of the pads 22, on the coordinate system, of the chip 14 of the semiconductor element to be tested are input to the probing apparatus in accordance with the types of semiconductor elements to be tested.

When the type names of the chips over the semiconductor substrate to be tested are input to the probing apparatus, those air cylinders 12 corresponding to the coordinate positions of the pads selected by the inputted data items are operated to allow the piston ends and corresponding probe needles 13 to be pushed down into contact with the corresponding pads. In this way, a predetermined measurement is carried out by a tester.

The dimensions of the respective component parts are listed, by way of example, below.

The holes 21 formed in the performance board 11 have a diameter of the order of 350 $\mu$m each and are arranged, as a row/column array, at an interval of the order of 300 $\mu$m. The probe needle 13 to be inserted into the hole 21 is about 2 mm in length, 300 $\mu$m in diameter. The air cylinder 12 has a diameter of order of 500 $\mu$m.

Figure 7:
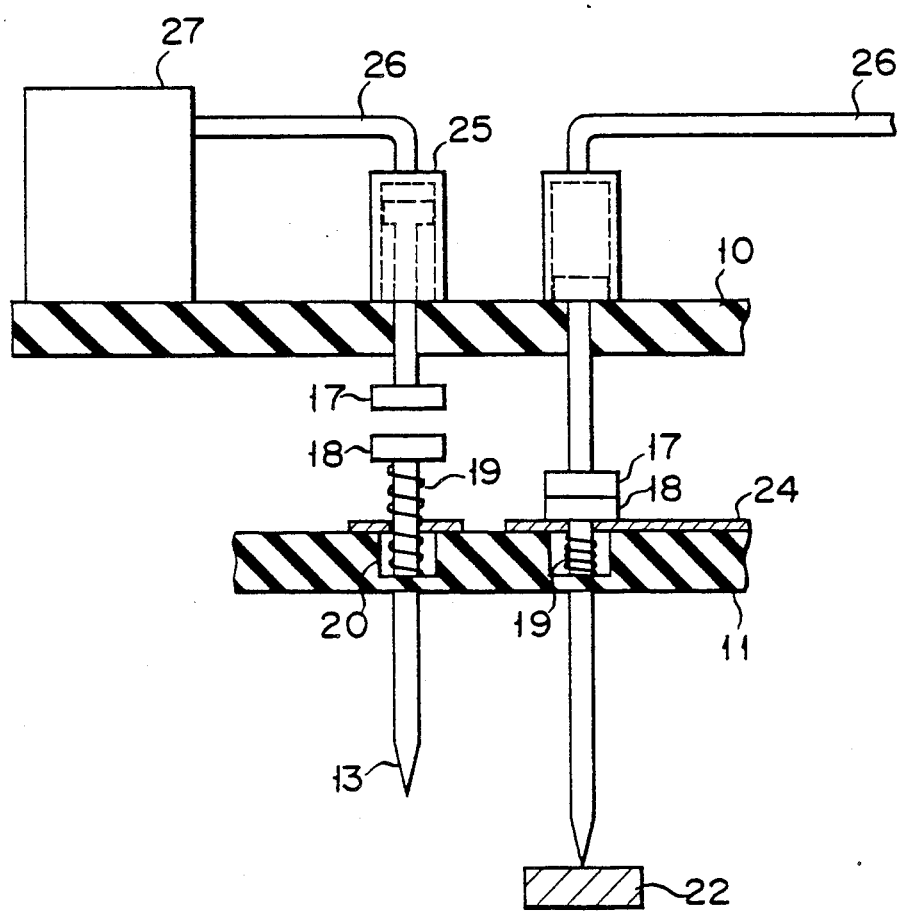
FIG. 7 is a cross-sectional view, similar to that of FIG. 4, showing a probe card according to another embodiment of the present invention.

As a probe needle reciprocating means for reciprocably moving probe needles through the performance board, use may be made, in place of the air cylinder, of apparatus, as shown in FIG. 7, comprising piston cylinders 25 having substantially the same diameter as that of the piston end 17, air hoses 26 connected at one end to the piston cylinders 25, and electromagnetic valves connected each to the other end of the air hose 26 to drive a connected piston, the piston cylinders 25 being mounted on the securing board in a manner to correspond to the probe needle as in the case of the aforementioned air cylinder and the probe needles corresponding in number to the electromagnetic valves. In this case, the aforementioned apparatus 27 need not be provided over the probe needle in a manner to correspond to the probe needle mounted in the performance board 11 and can be mounted on the securing board 10, greater in area than the performance board 11, at a location away from that on which the probe needles are mounted. Thus no restriction is imparted to the size of the apparatus 27. Further, the air hoses 26, being flexible in nature and bent or engaged relative to one another, involve no inconvenience upon the operation of the apparatus.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A probe card comprising:
   a securing board a performance board arranged opposite to the securing board and having a plurality of holes;
   a plurality of probe needles, each of which is, inserted through a hole of said performance board to allow it to be moved, in an up/down motion;
   a plurality of spring means, each biasing the corresponding needle into a retracted position away from a corresponding semiconductor element pad to be tested; and and
   a plurality of probe needle reciprocating means, each of which has a piston corresponding to the probe needle, each piston having one end projecting from the securing board and adapted to selectively push the probe needle, the number of the probe needle reciprocating means being equal to that of the probe needles, wherein the projecting ends of the pistons of the probe needle reciprocating means, selectively push the probe needles against a biasing force of the spring means and into contact with the corresponding semiconductor element pad.

2. The probe card according to claim 1, wherein said plurality of probe needle reciprocating means, each of which has a piston cylinder mounted on said securing board, each of these piston cylinders receiving another end of a said piston, and each of the piston cylinders having an electromagnetic valve connected thereto via a pressure supply tube;
   said said holes arranged on said performance board in a matrix at an interval of an order of 300 $\mu$m said holes have diameters of 350 $\mu$m;
   said probe needle has a diameter of 300 $\mu$m; and said piston cylinder has a diameter of 500 $\mu$m.

* * * * *

UNITED STATES PATENT AND TRADEMARK OFFICE
CERTIFICATE OF CORRECTION

PATENT NO. : 5,124,646
DATED : June 23, 1992
INVENTOR(S) : Shogo Shiraishi

It is certified that error appears in the above-identified patent and that said Letters Patent is hereby corrected as shown below:

Abstract, line 5, change "performnce" to --performance--.

Claim 1, column 5, line 20, after "securing board" insert --;--.

Claim 1, column 6, line 2, delete "and" (second occurence).

Claim 2, column 6, line 22, change "said said" to --said--.

Signed and Sealed this

Twenty-sixth Day of October, 1993

Attest:

BRUCE LEHMAN

Attesting Officer     Commissioner of Patents and Trademarks